United States Patent
Oka et al.

(10) Patent No.: US 6,184,337 B1
(45) Date of Patent: Feb. 6, 2001

(54) ADHESIVE TAPE FOR ELECTRONIC PARTS AND LIQUID ADHESIVE

(75) Inventors: Osamu Oka; Takeshi Nishigaya; Fumiyoshi Yamanashi, all of Shizuoka (JP)

(73) Assignee: Tomoegawa Paper Co., Ltd., Tokyo (JP)

( * ) Notice: Under 35 U.S.C. 154(b), the term of this patent shall be extended for 0 days.

(21) Appl. No.: 09/178,770

(22) Filed: Oct. 26, 1998

Related U.S. Application Data

(62) Division of application No. 08/642,371, filed on May 3, 1996, now Pat. No. 5,851,616.

(30) Foreign Application Priority Data

May 31, 1995 (JP) .................................................. 7-155474

(51) Int. Cl.[7] .............................................. C09J 133/24
(52) U.S. Cl. .................... 528/350; 528/171; 528/172; 528/176; 528/184; 528/185; 528/188; 528/352; 528/353; 528/360; 528/363; 528/367
(58) Field of Search .................................. 528/350, 352, 528/353, 360, 363, 367, 310, 171, 172, 176, 184, 185, 188

(56) References Cited

U.S. PATENT DOCUMENTS

| | | | | |
|---|---|---|---|---|
| 5,300,627 | * | 4/1994 | Kunimune ............................. | 528/353 |
| 5,508,357 | * | 4/1996 | Matsuura ............................. | 525/420 |
| 5,510,425 | * | 4/1996 | Matsuura ............................. | 525/423 |
| 5,663,287 | * | 9/1997 | Oka ..................................... | 528/350 |

* cited by examiner

Primary Examiner—Jenna Davis
(74) Attorney, Agent, or Firm—McDermott, Will & Emery

(57) ABSTRACT

The present invention provide a novel polyimide which is soluble in organic solvents and excels in heat resistance, and to a process for producing the polyimide. The polyimide of the present invention comprises a repeating unit represented by the formula (1) and having a number average molecular weight of from 4,000 to 200,000.

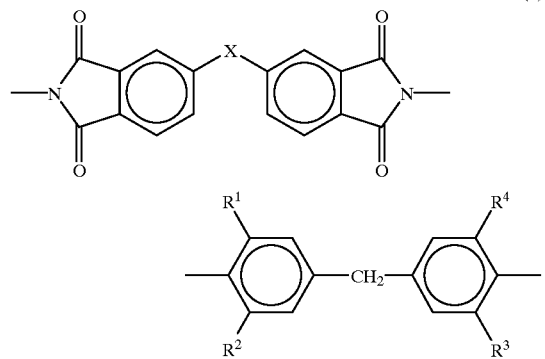

wherein X is $-SO_2-$ or $-C(=O)-OCH_2CH_2O-C(=O)-$, and $R^1$, $R^2$, $R^3$ and $R^4$ are independently an alkyl group having 1 to 4 carbon atoms or an alkoxy group having 1 to 4 carbon atoms.

9 Claims, 2 Drawing Sheets

ADHESIVE TAPE FOR ELECTRONIC PARTS AND LIQUID ADHESIVE

This application is a divisional of application Ser. No. 08/642,371 filed May 3, 1996 now U.S. Pat. No. 5,851,616.

BACKGROUND OF THE INVENTION

1) Field of the Invention

The present invention relates to adhesive tapes for electronic parts to be used for adhering between parts around leadframes making up a semiconductor device, e.g., lead pins, semiconductor chip mounted substrates, heat spreader, semiconductors themselves.

2) Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength immediately after taping and heat resistance enough for withstanding thermal process at the stages of assembling semiconductor devices. Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage.

In recent years, resin-molded type semiconductor devices as shown in FIGS. 1 to 3 have been developed or produced. In FIG. 1, the device has a construction in which lead pins 3 and plane 2 are connected by means of an adhesive layer 6, a semiconductor chip 1 is mounted on the plane 2, and together with bonding wires 4 between the semiconductor chip 1 and the lead pins 3, they are molded with a resin 5. In FIG. 2, the device has a construction in which the lead pins 3 on the leadframe are fixed with the semiconductor chip 1 and an adhesive layer 6 and together with a bonding wire 4, they are molded with a resin 5. In FIG. 3, the device has a construction in which a semiconductor chip 1 is mounted on a die pad, electrode 8 is fixed with an adhesive layer 6, the spaces between semiconductor chip 1 and an electrode 8 and between the electrode 8 and lead pins 3 are each connected with bonding wires 4, and they are molded with a resin 5.

In the adhesive layer in the resin-molded type semiconductor devices shown in FIGS. 1 to 3, the use of an adhesive tape to which a conventional adhesive is applied has the problems that the generated gas stains the lead to cause deterioration of the adhesive strength or causes generation of package crack, bacuse of insufficient thermal resistance.

The present invention has been made in the light of such situations associated with the prior arts and in order to improve such situations. An object of the present invention is, therefore, to provide an adhesive tape and a liquid adhesive for electric parts having sufficient thermal resistance and reliability.

SUMMARY OF THE INVENTION

An adhesive tape for electronic parts according to the first aspect of the present invention comprises an adhesive layer composed of a polyimide resin comprising a repeating unit represented by the following formula (1), provided on at least one surface of a heat resistance film:

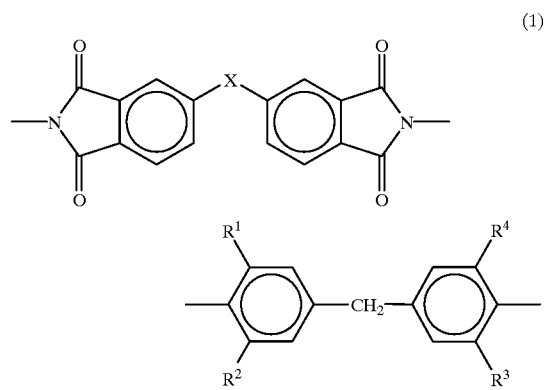

(1)

wherein X is —$SO_2$— or —C(=O)—$OCH_2CH_2O$—C(=O)—, and $R^1$, $R^2$, $R^3$ and $R^4$ are independently an alkyl group having 1 to 4 carbon atoms or an alkoxy group having 1 to 4 carbon atoms.

An adhesive tape for electronic parts according to the second aspect of the present invention comprises an adhesive layer composed of a polyimide resin comprising a repeating unit represented by the above formula (1), provided on at least one surface of a release film.

A liquid adhesive for electronic parts according to the present invention comprises a polyimide resin comprising a repeating unit represented by the above formula (1) dissolved in an organic solvent.

DETAILED DESCRIPTION OF PREFERRED EMBODIMENTS

Figure 1:
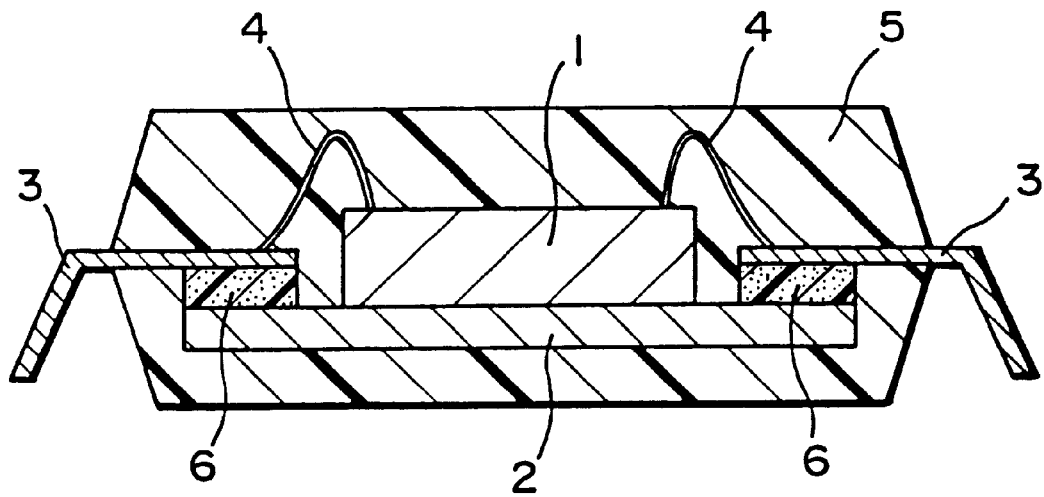
FIG. 1 is a cross-sectional view of one embodiment of a resin-molded type semiconductor device using an adhesive tape of the present invention or a conventional adhesive tape.
Figure 2:
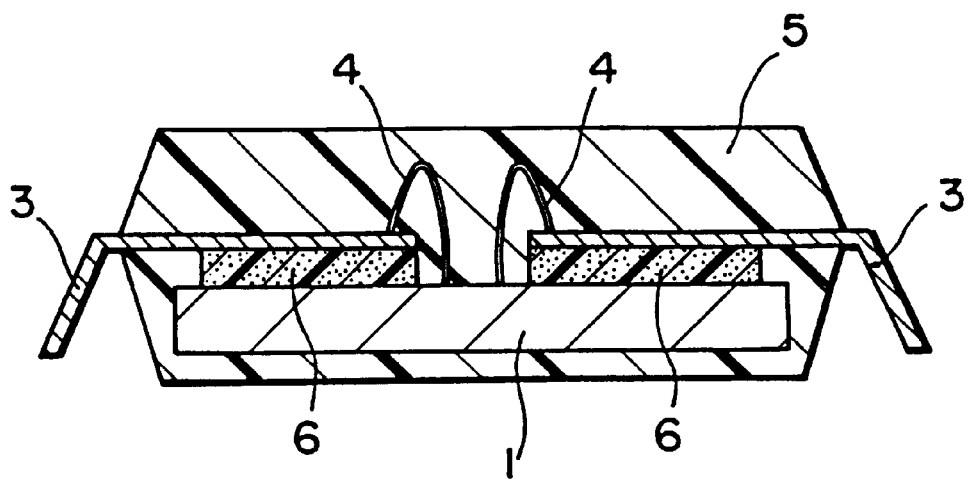
FIG. 2 is a cross-sectional view of another embodiment of a resin-molded type semiconductor device using an adhesive tape of the present invention or a conventional adhesive tape.
Figure 3:
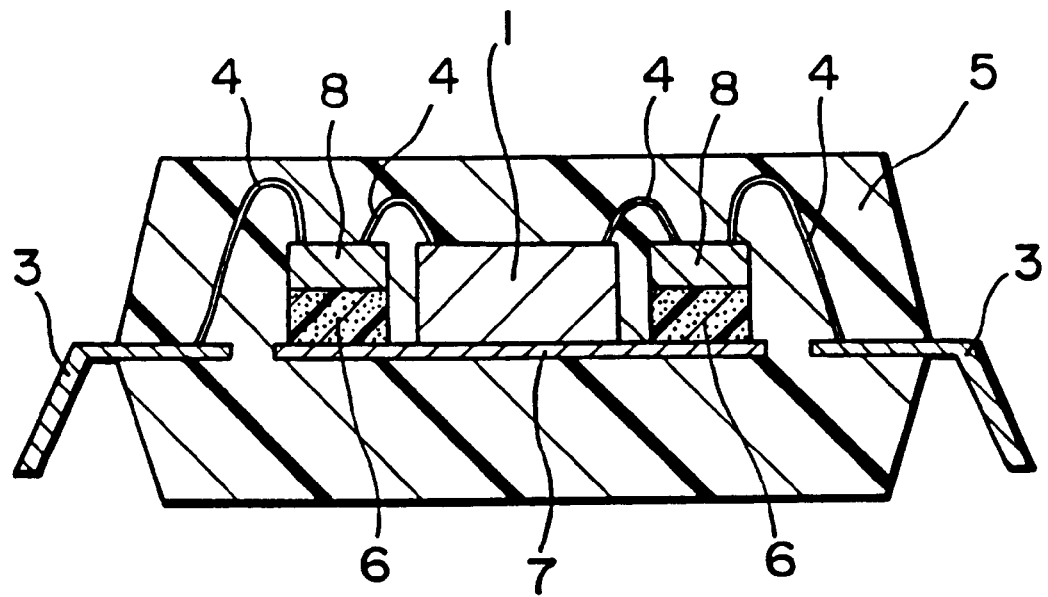
FIG. 3 is a cross-sectional view of still another embodiment of a resin-molded type semiconductor device using an adhesive tape of the present invention or a conventional adhesive tape.

The embodiments of the present invention will now be described in detail.

The polyimide resin which can be used in the adhesive tape and the liquid adhesive for electric parts of the present invention contains a repeating unit represented by the above formula (1). Typical examples thereof are as follows:

(I) Polyimide resin consisting of a repeating unit represented by the following formula (2):

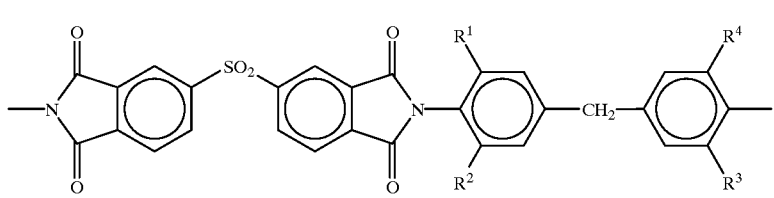

(2)

wherein $R^1$, $R^2$, $R^3$ and $R^4$ are independently an alkyl group having 1 to 4 carbon atoms or an alkoxy group having 1 to 4 carbon atoms.

(II) Polyimide resin consisting of a repeating unit represented by the following formula (3):

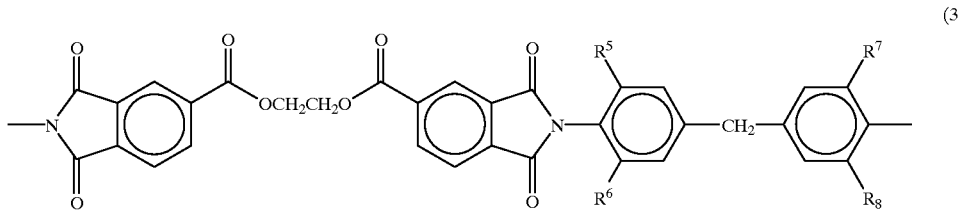

(3)

wherein $R^5$, $R^6$, $R^7$ and $R^8$ are independently an alkyl group having 1 to 4 carbon atoms or an alkoxy group having 1 to 4 carbon atoms.

(III) Polyimide resin consisting of a repeating unit represented by the above formula (2) and a repeating unit represented by the above formula (3), the proportion of these repeating units being voluntary. In this polyimide resin, when the proportion of the repeating unit (3) is higher, the glass transition point, i.e., a temperature capable of adhering the adhesive, may be lowered.

(IV) Polyimide resin consisting of a repeating unit represented by the above formula (1) and a repeating unit represented by the following formula (4):

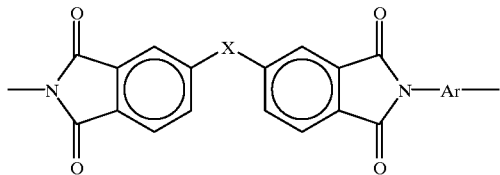

(4)

wherein X is —$SO_2$— or —C(=O)—$OCH_2CH_2O$—C(=O)—, and Ar is a divalent group having 1 to 6 benzene rings, provided that Ar is a tetraalkyl substituent of diphenylmethane or a tetraalkoxy substituent of diphenylmethane is excluded out.

In the above polyimide resin, it is preferred that the proportion of the repeating unit represented by the formula (1) is 40 to 99 mol %, and that of the repeating unit represented by the formula (4) is 60 to 1 mol %. When the proportion of the repeating unit represented by the formula (4) exceeds 60 mol %, the solubility in a solvent is drastically decreased. In particular, in the case where high solubility in a solvent is required, the proportion of the repeating unit represented by the formula (4) is desirably not more than 30 mol %.

(V) Polyimide resin consisting of a repeating unit represented by the above formula (1) and a repeating unit represented by the following formula (5):

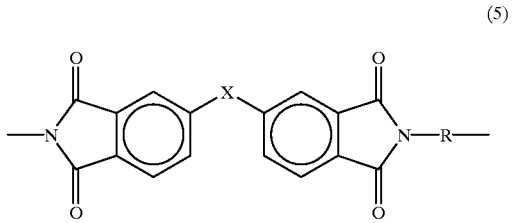

(5)

wherein X is —$SO_2$— or —C(=O)—$OCH_2CH_2O$—C(=O)—, and R is an alkylene group having 2 to 20 carbon atoms or a dimethylsiloxane group represented by the formula: —R'—[Si(CH$_3$)$_2$O]$_n$Si(CH$_3$)$_2$—R'— where R' is an alkylene group having 1 to 10 carbon atoms or phenoxymethylene group and n is an integer of from 1 to 20.

In the above polyimide resin, it is preferred that the proportion of the repeating unit represented by the formula (1) is 40 to 99 mol %, and that of the repeating unit represented by the formula (5) is 60 to 1 mol %. When the proportion of the repeating unit represented by the formula (5) exceeds 60 mol %, the solubility in a solvent is drastically decreased. In particular, in the case where high solubility in a solvent is required, the proportion of the repeating unit represented by the formula (5) is desirably not more than 30 mol %.

(VI) Polyimide resin consisting of a repeating unit represented by the above formula (1) and a repeating unit represented by the following formula (6):

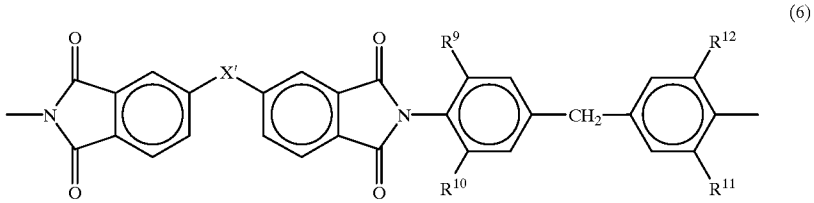
(6)

wherein X' is a direct bond, —O—, —C(=O)—, —C(CH₃)₂— or —C(CF₃)₂—, and $R^9$, $R^{10}$, $R^{11}$ and $R^{12}$ are independently an alkyl group having 1 to 4 carbon atoms or an alkoxy group having 1 to 4 carbon atoms.

In the above polyimide resin, it is preferred that the proportion of the repeating unit represented by the formula (1) is 40 to 99 mol %, and that of the repeating unit represented by the formula (6) is 60 to 1 mol %. When the proportion of the repeating unit represented by the formula (6) exceeds 60 mol %, the solubility in a solvent is drastically decreased. In particular, in the case where high solubility in a solvent is required, the proportion of the repeating unit represented by the formula (6) is desirably not more than 30 mol %.

The above polyimide resins to be used in the present invention can be produced according to conventional processes for producing polyimides. In concrete, they can be produced from a tetracarboxylic dianhydride corresponding to the desired repeating unit and a diamine or diisocyanate corresponding to the desired repeating unit.

Typically, the above polyimide resins (I)–(III) can be produced by reacting a tetracarboxylic dianhydride represented by the following formula (7) with a compound represented by the following formula (8).

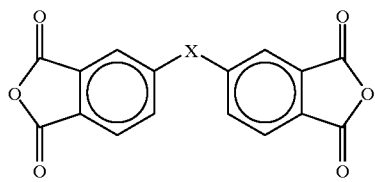
(7)

wherein X is —SO₂— or —C(=O)—OCH₂CH₂O—C(=O)—.

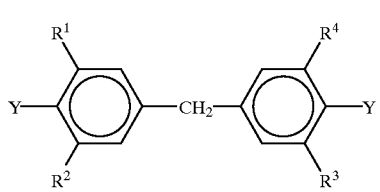
(8)

wherein $R^1$, $R^2$, $R^3$ and $R^4$ are independently an alkyl group having 1 to 4 carbon atoms or an alkoxy group having 1 to 4 carbon atoms, and Y is an amino group or isocyanate group.

The above polyimide resin (IV) can be produced by reacting a tetracarboxylic dianhyride represented by the above formula (7) with a compound represented by the above formula (8) and a compound represented by the following formula (9).

Y—Ar—Y (9)

wherein Ar is a divalent group having 1 to 6 benzene rings and Y is an amino group or isocyanate group, provided that Ar is a tetraalkyl substituent of diphenylmethane or a tetraalkoxy substituent of diphenylmethane is excluded out.

The above polyimide resin (V) can be produced by reacting a tetracarboxylic dianhydride represented by the above formula (7) with a compound represented by the above formula (8) and a compound represented by the following formula (10).

Y—R—Y (10)

wherein R is an alkylene group having 2 to 20 carbon atoms or a dimethylsiloxane group represented by the formula: —R'—[Si(CH₃)₂O]ₙSi(CH₃)₂—R'— where R' is an alkylene group having 1 to 10 carbon atoms or phenoxymethylene group and n is an integer of from 1 to 20, and Y is an amino group or isocyanate group.

The above polyimide resin (VI) can be produced by reacting a tetracarboxylic dianhyride represented by the above formula (7) with a compound represented by the above formula (8) and a compound represented by the following formula (11).

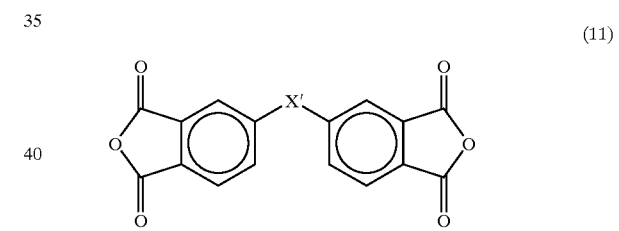
(11)

wherein X' is a direct bond, —O—, —C(=O)—, —C(CH₃)₂—, or —C(CF₃)₂—.

In the polyimides of the present invention, examples of tetracarboxylic dianhyrides represented by the formula (7) which forms the basic construction of the polyimides include two type compounds where X in the formula (7) is —SO₂— or —C(=O)—OCH₂CH₂O—C(=O)—, i.e., 3,3',4,4'-diphenylsulfonetetracarboxylic dianhydride and ethylene glycol bistrimelitate dianhydride.

In the polyimides of the present invention, examples of the diphenylmethane derivatives which make up another basic repeating unit represented by the above formula (8) having the functional group Y of amino group, i.e. diamine, include the following compounds.

4,4'-diamino-3,3',5,5'-tetramethyldiphenylmethane, 4,4'-diamino-3,3',5,5'-tetraethyldiphenylmethane, 4,4'-diamino-3,3',5,5'-tetra(n-propyl)diphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-dimethyl-5,5'-diethyldiphenylmethane, 4,4'-diamino-3,3'-dimethyl-5,5'-diisopropyldiphenylmethane, 4,4'-diamino-3,3'-dimethyl-5,5'-dibutyldiphenylmethane, 4,4'-diamino-3,3'-diethyl-5,5'-diisopropyldiphenylmethane, 4,4'-diamino-3,3'-diethyl-5,5'- dibutyldiphenylmethane, 4,4'-diamino-3,3'-diisopropyl-5,5'-dibutyldiphenylmethane, 4,4'-diamino-3,5-dimethyl-3'5'-diethyldiphenylmethane, 4,4'-diamino-3,5-dimethyl-3'5'-diisopropyldiphenylmethane, 4,4'-diamino-3,5-dimethyl-3',5'-dibutyldiphenylmethane, 4,4'-diamino-3,5-diethyl-3',5'-diisopropyldiphenylmethane, 4,4'-diamino-3,5-diethyl-3'5'-dibutyldiphenylmethane, 4,4'-diamino-3,5-diisopropyl-3'5'-dibutyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3',5,5'-tetra(n-propoxy)diphenylmethane, 4,4'-diamino-3,3',5,5'-tetraisopropoxydiphenylmethane, 4,4'-diamino-3,3',5,5'-tetrabutoxydiphenylmethane, and the like. Examples of isocyanates which are the diphenylmethane derivatives represented by the formula (8) wherein the functional group Y is an isocyanate group include those exemplified in the above mentioned diamines in which "amino" is replaced by "isocayanate".

In the present invention, the compounds represented by the formula (9) include those having 1 to 6 benzene groups as Ar. It is preferable for enhancing the solubility of the resulting polyimide in a solvent that Ar preferably comprises two or more benzene rings connected via —O—, —S—, —CH$_2$—, —C(=O)—, —CONH—, —COO—, —SO$_2$—, —C(CH$_3$)$_2$—, —C(CF$_3$)$_2$—, etc. in straight form and in the meta or para position. The hydrogens in each benzene rings may optionally be substituted with substituents.

Typical examples of the diamine in the compounds represented by the formula (9) wherein the functional group Y is amino group are p-phenylenediamine, m-phenylenediamine, tolylenediamine, xylylenediamine, 3,4'-oxydianiline, 4,4'-oxydianiline, 4,4'-diaminodiphenylmethane, 3,4'-diaminodiphenylmethane, 3,3'-diaminodiphenylmethane, 4,4'-diamino-3,3'-dimethyldiphenylmethane, 4,4'-diamino-3,3'-diethyldiphenylmethane, 4,4'-diamino-3,3'-dimethoxydiphenylmethane, 4,4'-diamino-3,3'-diethoxydiphenylmethane, 4,4'-diaminobenzanilide, 4,4'-diaminobenzophenone, 3,3'-diaminobenzophenone, 4,4'-diaminodiphenylsulfone, 3,3'-diaminodiphenylsulfone, 4,4'-(isopropylidene)dianiline, 3,3'-(isopropylidene)dianiline, 4,4'-diaminobenzophenone, bis[2-(4-aminophenyl)propane]-benzene, bis(aminophenoxy)benzene, bis(aminophenoxy)-biphenyl, bis(aminophenoxy)diphenyl ether, bis(aminophenoxyphenyl)propane, bis(aminophenoxyphenyl)sulfone, bis(aminophenoxyphenyl)ketone, bis(aminophenoxyphenyl)hexafluoropropane, bis(aminophenoxyphenyl)biphenyl, bis(aminophenoxyphenyl)diphenyl ether, 4,4'-bis[3-(4-amino-α,α'-dimethylbenzyl)phenoxy]diphenylsulfone, 4,4'-bis[3-(4-amino-α,α'-dimethylbenzyl)phenoxy]benzophenone, 4,4'-bis[4-(4-amino-α, α'-dimethylbenzyl)phenoxy]diphenylsulfone, 4,4'-bis[4-(4-amino-α, α'-dimethylbenzyl)phenoxy]-benzophenone, and the like, and they can be used as a mixture.

Examples of diisocyanates in the compounds represented by the formula (9) wherein the functional group Y is isocyanate group include those exemplified in the above diamine in which "amino" is replaced by "isocyanate", in addition to diphenylmetahane diisocyanate, tolylene diisocyanate, and the like.

Examples of the diamines in the compounds represented by the formula (10) wherein the functional group Y is amino group include ethylenediamine, propylenediamine, 1,4-diaminobutane, hexamethylenediamine, octamethylenediamine, decamethylenediamine, hexadecamethylenediamine, dodecamethylenediamine, bis(3-aminopropyl)tetramethyldisiloxane, tetramer and octamer of dimethylsiloxane having aminopropyl at the terminal, bis(3-aminophenoxymethyl)tetramethyldisiloxane, etc., and they can be used as a mixture. Examples of the diisocyanates in the compounds represented by the formula (10) wherein the functional group Y is isocyanate include those exemplified in the above diamines wherein "amino" is replaced by "isocyanate".

Examples of the tetracarboxylic dianhydrides represented by the above formula (11) include five types wherein X' in the formula (11) is a direct bond, —O—, —C(=O)—, —C(CH$_3$)$_2$—, and —C(CF$_3$)$_2$—. Typical examples thereof are 3,3',4,4'-biphenyl-tetracarboxylic dianhydride, 3,3',4,4'-diphenylether-tetracarboxylic dianhydride, 3,3',4,4'-benzophenone-tetracarboxylic dianhydride, 4,4'-(isopropylidene)diphthalic anhydride, and 4,4'-(hexafluoropropylidene)diphthalic anhydride. They can be used as a mixture.

The polyimide resins of the present invention can be produced as follows.

Examples of processes for producing the polyimide using a tetracarboxylic dianhyride and diamine as the raw materials for the polyimide include the following. A process for directly obtaining a polyimide by heating a tetracarboxylic dianhydride and a diamine in an organic solvent, optionally in the presence of a catalyst (in an amount of not more than 20 parts by weight of the reactants) such as tributylamine, triethylamine, or triphenyl phosphonate to a temperature of not less than 100° C., and preferably not less than 180° C. A process for obtaining a polyimide by reacting a tetracarboxylic dianhyride with a diamine in an organic solvent at a temperature of not more than 10020 C. to obtain a polyamic acid which is a precursor of the polyimide, optionally adding a dehydrating such as p-toluenesulfonic acid (in an amount of 1 to 5 time mol of the tetracarboxylic dianhydride), and then heating the solution to cause an imidation. A process in which the above-mentioned polyamic acid is caused to a ring closing reaction at a relatively low temperature (in a range from room temperature to 100° C.) by adding dehydrating ring closing agent such as an anhydride, e.g., acetic anhydride, propionic anhydride or benzoic anhydride, a carbodiimide compound, e.g., dicylohexylcarbodiimide, and optionally a ring closing catalyst such as pyridine, isoquinoline, imidazole and triethylamine (as for the dehydrating ring closing agent and ring closing catalyst, in an amount of 2 to 10 time mol of the tetracarboxylic dianhydride).

Examples of the organic solvents used in this reaction include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichlene, and nitrobenzene can be mixed with the above-mentioned solvents as a mixture.

In the case where a tetracarboxylic dianhydride and a diisocyanate are used as the raw materials, the product can be produced according to the above-mentioned process for directly obtaining a polyimide resin. In this case, the reaction temperature is preferably not less than room temperature, and particularly not less than 60° C.

In the present invention, the polyimide resin having a high polymerization degree can be produced by the reaction between equimolar amounts of the tetracarboxylic dianhydride and the diamine or diisocyanate. If necessary, the molar ratio of tetracarboxylic dianhydride to the diamine or diisocyanate can be varied in a range of from 11:10 to 10:11, by which the polyimide resin can be produced.

Since the film formability depends upon molecular weight of the polyimide resin used in the present invention, the molecular weight can be optimally decided according to desired film formability. When being used in the present invention, polyimide resin having too low molecular weight is not preferred because film formability in some degree is required in the adhesive layer even in the case of the liquid form and the heat resistance is also lowered. In the present invention, the molecular weight is required to be not less than 4,000. When being used as a thermoplasitic adhesive, the adhesion is changed for the worse, if the viscosity during the melting is too high. The molecular weight is a factor for controlling the viscosity during the melting. In the case of the polyimide resin used in the present invention, the number molecular weight is approximately not more than 400,000. If the molecular weight is higher than this value, there is a high increase in the viscosity making it difficult to be used as an adhesive.

The liquid adhesive of the present invention is produced by dissolving the polyimide resin in an organic solvent. Examples of the organic solvents used for dissolving the polyimide resin include various organic solvents such as aprotic polar solvents, e.g., N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alchoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloroform, and the like can be mixed and used in such a degree that the polyimide resin is not separated.

Since the required viscosity and volatility change depending upon the process for applying the liquid adhesive and the base to be applied, the solvent for the liquid adhesive of the present invention can be optimally selected from the above solvents according to the applications.

In the liquid adhesive of the present invention, a filler having a particle size of not more than 1 $\mu$m may be incorporated for the purpose of controlling the characteristics during the adhering. The content of the filler when being incorporated is preferably from 1 to 50% by weight, and more preferably from 4 to 25% by weight, based on the total solid content. If the content of the filler exceeds 50% by weight, the adhesion strength is remarkably lowered. Conversely, if it is less than 1% by weight, no effect of the addition of the filler can be obtained.

Examples of the fillers which can be used are silica, quarts powder, mica, alumina, diamond powser, zircon powder, calcium carbonate, magnesium oxide, fluorine containing resin, and the like.

The adhesive tapes for electronic parts according to the first and the second aspects of the present invention can be produced by using the above liquid adhesive. The adhesive tape of the first aspect is produced by applying the liquid adhesive of the present invention to one side or both sides of a heat resistant film, followed by drying the resultant laminate. The adhesive tape of the second aspect is produced by applying the liquid adhesive of the present invention to one side or both sides of a release film, followed by drying the resultant laminate.

Examples of the heat resistant films include heat resistance films made of polyimide, polyphenylene sulfide, polyether, polyparabanic acid and polyethylene terephthalate, etc., and composite heat resistant film such as epoxy resin/glass cloth, epoxy resin/polyimide/glass cloth, and polyimide film, etc. is praticularly preferred.

The heat resistant film which is prefrably used has a thickness of from 5 to 150 $\mu$m, and more preferably from 10 to 75 $\mu$m. If the thickness of the heat resistant film is too thick, the operation of punching the adhesive film becomes difficult. Conversely, it it is too thin, the rigidity of the film becomes insufficient.

The release film in the adhesive tape of the second aspect of the present invention serves as a temporary base, which has a thickness of from 1 to 200 $\mu$m. Typical examples of the release film used include resin films made of polyethylene, polypropylene, fluorine containing resin, polyethylene terephthalate, polyimide, etc. and paper, and those the surface of which is subjected to releasing treatment with a silicone releasing agent.

The adhesive layer formed on a side or both sides of the above-mentioned heat resistant film and that formed on a side of the release film may have a thickness in a range of from 1 $\mu$m to 100 $\mu$m and preferably from 5 $\mu$m to 50 $\mu$m. It is possible to provide on the formed adhesive layer the above-mentioned release film as a protective layer.

As be clear from the results of examination shown hereafter, the liquid adhesive and the adhesive tape for electronic parts of the present invention have sufficient heat resistance and reliability, and they can suitably be used as an adhesive tape for the innerlead fix of the leadframe and a TAB tape, e.g., for bonding between parts constituting the semiconductor device, for example, lead pins, semiconductor-mounted substrate, heat spreader, and semiconductor chips themselves.

EXAMPLE

The present invention will now be described in greater detail. First, examples for producing the liquid adhesive are shown.

Example 1

Into a flask equipped with a stirrer were introduced 12.72 g (50 mmol) of 4,4'-diamino-3,3',5,5'-tetramethyldiphenylmethane, 17.91 g (50 mmol) of 3,3',4,4'-diphenylsulfonetetracarboxylic dianhydride, and 150 ml of N-methyl-2-pyrrolidone at an iced temperature, and stirring was continued for 1 hour. Consequently, the solution was reacted at 40° C. for 3 hours to synthesize a polyamic acid. To the resulting polyamic acid were added 50 ml of toluene and 1.0 g of p-toluenesulfonic acid, the mixture was heated to 160° C., and an imidation reaction was carried out for 3 hours while separating water which was flowed by being azeotropically distilled with toluene. After toluene was distilled off, the resulting polyimide varnish was poured in methanol, and the separation of the resulting precipitate, pulverization, washing, and drying stages gave a polyimide resin consisting of a repeating unit of the formula (2). The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determinded. The results are shown in Table 1.

A liquid ahdesive was produced by dissolving the resultant polyimide resin in tetrahydrofuran (THF) so as to be the concentration of 25% by weight.

Example 2

Using 15.52 g (50 mmol) of 4,4'-diamino-3,3',5,5'-tetraethyldiphenylmethane, 17.91 g (50 mmol) of 3,3',4,4'-diphenylsulfonetetracarboxylic dianhydride and 150 ml of N-methyl-2-pyrrolidone, a polyimide resin consisting of the repeating unit represented by the formula (2) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 3

Using 12.72 g (50 mmol) of 4,4'-diamino-3,3',5,5'-tetramethyldiphenylmethane, 20.51 g (50 mmol) of ethylene glycol bistrimellitate dianhydride and 150 ml of N-methyl-2-pyrrolidone, a polyimide resin consisting of the repeating unit represented by the formula (3) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 4

Using 15.52 g (50 mmol) of 4,4'-diamino-3,3',5,5'-tetraethyldiphenylmethane, 20.51 g (50 mmol) of ethylene glycol bistrimellitate dianhydride and 150 ml of N-methyl-2-pyrrolidone, a polyimide resin consisting of the repeating unit represented by the formula (3) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 5

Using 15.52 g (50 mmol) of 4,4'-diamino-3,3',5,5'-tetraethyldiphenylmethane, 13.34 g (37.5 mmol) of 3,3',4,4'-diphenylsulfonetetracarboxylic dianhydride, 5.13 g (12.5 mmol) of ethylene glycol bistrimellitate dianhydride and 150 ml of N-methyl-2-pyrrolidone, a polyimide resin consisting of the repeating units represented by the formulae (2) and (3) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 6

Using 15.52 g (50 mmol) of 4,4'-diamino-3,3',5,5'-tetraethyldiphenylmethane, 8.89 g (25 mmol) of 3,3',4,4'-diphenylsulfonetetracarboxylic dianhydride, 10.26 g (25 mmol) of ethylene glycol bistrimellitate dianhydride and 150 ml of N-methyl-2-pyrrolidone, a polyimide resin consisting of the repeating units represented by the formulae (2) and (3) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 7

Using 12.72 g (50 mmol) of 4,4-diamino-3,3',5,5'-tetramethyldiphenylmethane, 4.48 g (12.5 mmol) of 3,3',4,4'-diphenylsulfonetetracarboxylic dianhydride, 15.39 g (37.5 mmol) of ethylene glycol bistrimellitate dianhydride and 150 ml of N-methyl-2-pyrrolidone, a polyimide resin consisting of the repeating units represented by the formulae (2) and (3) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 8

Using 7.76 g (25 mmol) of 4,4'-diamino-3,3',5,5'-tetraethyldiphenylmethane, 10.26 g (25 mmol) of 2,2-bis[4-(4-aminophenoxy)phenyl]propane, 17.91 g (50 mmol) of 3,3',4,4'-diphenylsulfonetetracarboxylic dianhydride and 150 ml of N-methyl-2-pyrrolidone, a polyimide resin consisting of the repeating units represented by the formulae (2) and (4) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 9

Using 11.64 g (37.5 mmol) of 4,4'-diamino-3,3',5,5'-tetraethyldiphenylmethane, 2.50 g (12.5 mmol) of 3,4'- oxydianiline, 17.91 g (50 mmol) of 3,3',4,4'-diphenylsulfonetetracarboxylic dianhydride and 150 ml of N-methyl-2-pyrrolidone, a polyimide resin consisting of the repeating units represented by the formulae (2) and (4) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 10

Using 11.64 g (37.5 mmol) of 4,4'-diamino-3,3',5,5'-tetraethyldiphenylmethane, 3.65 g (12.5 mmol) of 1,3-bis(4-aminophenoxy)benzene, 17.91 g (50 mmol) of 3,3',4,4'-diphenylsulfonetetracarboxylic dianhydride and 150 ml of N-methyl-2-pyrrolidone, a polyimide resin consisting of the repeating units represented by the formulae (2) and (4) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 11

Using 11.64 g (37.5 mmol) of 4,4'-diamino-3,3',5,5'-tetraethyldiphenylmethane, 4.31 g (12.5 mmol) of 1,3-bis[2-(4-aminophenyl)isopropylidene]benzene, 17.91 g (50 mmol) of 3,3',4,4'-diphenylsulfonetetracarboxylic dianhydride and 150 ml of N-methyl-2-pyrrolidone, a polyimide resin consisting of the repeating units represented by the formulae (2) and (4) was obtained as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 12

Using 11.64 g (37.5 mmol) of 4,4'-diamino-3,3',5,5'-tetraethyldiphenylmethane, 5.41 g (12.5 mmol) of bis[4-(3-aminophenoxy)phenyl]sulfone, 17.91 g (50 mmol) of 3,3',4,4'-diphenylsulfonetetracarboxylic dianhydride and 150 ml of N-methyl-2-pyrrolidone, a polyimide resin consisting of the repeating units represented by the formulae (2) and (4) was obtained as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 13

Using 11.64 g (37.5 mmol) of 4,4'-diamino-3,3',5,5'-tetraethyldiphenylmethane, 7.91 g (12.5 mmol) of 4,4'-bis[3-(4-amino-α, α'-dimethylbenzyl)phenoxy]benzophenone, 17.91 g (50 mmol) of 3,3',4,4'-diphenylsulfonetetracarboxylic dianhydride and 150 ml of N-methyl-2-pyrrolidone, a polyimide resin consisting of the repeating units represented by the formulae (2) and (4) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 25% by weight.

Example 14

Using 7.76 g (25 mmol) of 4,4'-diamino-3,3',5,5'-tetraethyldiphenylmethane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, a polyimide resin consisting of the repeating units represented by the formulae (2) and (5) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 15

Using 11.64 g (37.5 mmol) of 4,4'-diamino-3,3',5,5'-tetraethyldiphenylmethane, 3.11 g (12.5 mmol) of 1,3-bis(3-aminopropyl)-1,1,3,3-tetramethyldisiloxne, 20.51 g (50 mmol) of ethylene glycol bistrimellitate dianhydride and 150 ml of N-methyl-2-pyrrolidone, a polyimide resin consisting of the repeating units represented by the formulae (3) and (5) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 16

Using 11.64 g (40 mmol) of 4,4'-diamino-3,3',5,5'-tetraethyldiphenylmethane, 1.44 g (10 mmol) of octamethylenediamine, 17.91 g (50 mmol) of 3,3',4,4'- diphenylsulfonetetracarboxylic dianhydride and 150 ml of N-methyl-2-pyrrolidone, a polyimide resin consisting of the repeating units represented by the formulae (2) and (5) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 17

Using 15.52 g (50 mmol) of 4,4'-diamino-3,3',5,5'-tetraethyldiphenylmethane, 10.75 g (40 mmol) of 3,3',4,4'-diphenylsulfonetetracarboxylic dianhydride, 4.44 g (10 mmol) of 4,4'-(hexafluoroisopropylidene)diphthalic anhydride and 150 ml of N-methyl-2-pyrrolidone, a polyimide resin consisting of the repeating units represented by the formulae (2) and (6) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 18

Using 15.52 g (50 mmol) of 4,4'-diamino-3,3',5,5'-tetraethyldiphenylmethane, 8.96 g (25 mmol) of 3,3',4,4'-diphenylsulfonetetracarboxylic dianhydride, 7.36 g (25 mmol) of biphenyltetracarboxylic dianhydride and 150 ml of N-methyl-2-pyrrolidone, a polyimide resin consisting of the repeating units represented by the formulae (2) and (6) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 19

Using 15.52 g (50 mmol) of 4,4'-diamino-3,3',5,5'-tetraethyldiphenylmethane, 10.26 g (25 mmol) of ethylene glycol bistrimellitate dianhydride, 7.36 g (25 mmol) of biphenyltetracarboxylic dianhydride and 150 ml of N-methyl-2-pyrrolidone, a polyimide resin consisting of the repeating units represented by the formulae (3) and (6) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 20

Using 15.52 g (50 mmol) of 4,4'-diamino-3,3',5,5'-tetraethyldiphenylmethane, 13.43 g (37.5 mmol) of 3,3',4,4'-diphenylsulfonetetracarboxylic dianhydride, 4.03 g (12.5 mmol) of benzophenonetetracarboxylic dianhydride and 150 ml of N-methyl-2-pyrrolidone, a polyimide resin consisting of the repeating units represented by the formulae (2) and (6) was obtained as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 21

Using 15.52 g (50 mmol) of 4,4'-diamino-3,3',5,5'-tetraethyldiphenylmethane, 13.43 g (37.5 mmol) of 3,3',4,4'-diphenylsulfonetetracarboxylic dianhydride, 3.88 g (12.5 mmol) of diphenyl ether tetracarboxylic dianhydride and 150 ml of N-methyl-2-pyrrolidone, a polyimide resin consisting of the repeating units represented by the formulae (2) and (6) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 20% by weight.

Example 22

Using 15.52 g (50 mmol) of 4,4'-diamino-3,3',5,5'-tetraethyldiphenylmethane, 13.43 g (37.5 mmol) of 3,3',4,4'-diphenylsulfonetetracarboxylic dianhydride, 4.20 g (12.5 mmol) of 4,4'-(isopropylidene)diphthalic anhydride and 150 ml of N-methyl-2-pyrrolidone, a polyimide resin consisting of the repeating units represented by the formulae (2) and (6) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 30% by weight.

Example 23

Using 7.76 g (25 mmol) of 4,4'-diamino-3,3',5,5'-tetraethyldiphenylmethane, 6.21 g (25 mmol) of 1,3-bis(3-aminopropyl)-1,1,3,3-tetramethyldisiloxane, 8.96 g (25 mmol) of 3,3',4,4'-diphenylsulfonetetracarboxylic dianhydride, 10.26 g (25 mmol) of ethylene glycol bistrimellitate dianhydride and 150 ml of N-methyl-2-pyrrolidone, a polyimide resin consisting of the the repeating units represented by the formulae (2), (3) and (6) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 40% by weight.

Example 24

Using 6.36 g (25 mmol) of 4,4'-diamino-3,3',5,5'-tetramethyldiphenylmethane, 7.76 g (25 mmol) of 4,4'-diamino-3,3',5,5'-tetraethyldiphenylmethane, 8.96 g (25 mmol) of 3,3',4,4'-diphenylsulfonetetracarboxylic dianhydride, 10.26 g (25 mmol) of ethylene glycol bistrimellitate dianhydride and 150 ml of N-methyl-2-pyrrolidone, a polyimide resin consisting of the the repeating units represented by the formulae (2), (3) and (6) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 40% by weight.

Example 25

Using 11.64 g (37.5 mmol) of 4,4'-diamino-3,3',5,5'-tetraethyldiphenylmethane, 3.11 g (12.5 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, 27.8 g of a polyimide resin consisting of the repeating units represented by the formulae (2) and (5) was obtained as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 40% by weight.

Example 26

Using 12.42 g (40 mmol) of 4,4'-diamino-3,3',5,5'-tetraethyldiphenylmethane, 2.48 g (10 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, 27.9 g of a polyimide resin consisting of the repeating units represented by the formulae (2) and (5) was obtained as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 40% by weight.

Example 27

Using 14.12 g (50 mmol) of 4,4'-diamino-3,3'-diethyl-5,5'-dimethyldiphenylmethane, 17.91 g (50 mmol) of 3,3',4,4'-diphenylsulfonetetracarboxylic dianhydride and 150 ml of N-methyl-2-pyrrolidone, 31.4 g of a polyimide resin consisting of the repeating unit represented by the formula (2) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 20% by weight.

Example 28

Using 11.30 g (40 mmol) of 4,4'-diamino-3,3'-diethyl-5,5'-dimethyldiphenylmethane, 2.48 g (10 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, 31.1 g of a polyimide resin consisting of the repeating units represented by the formulae (2) and (5) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 29

Using 7.06 g (25 mmol) of 4,4'-diamino-3,3'-diethyl-5,5'-dimethyldiphenylmethane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, 28.6 g of a polyimide resin consisting of the repeating units represented by the formulae (2) and (5) was obtained by the same manner as in Example 1.

The IR spectrum measurement of the resulting polyimide resin showed typical absorption bands of imide at 1720 cm$^{-1}$ and 1780 cm$^{-1}$. The molecular weight, glass transition point and temperature of initiating thermal decomposition of the polyimide were determined. The results are shown in Table 1.

A liquid ahdesive was produced by dissolving the resultant polyimide resin in tetrahydrofuran so as to be the concentration of 35% by weight.

Example 30

Using 10.87 g (35 mmol) of 4,4'-diamino-3,3',5,5'-tetraethyldiphenylmethane, 2.48 g (10 mmol) of 1,3-bis(3-aminopropyl)-1,1,3,3-tetramethyldisiloxane, 17.91 g (50 mmol) of 3,3',4,4'-diphenylsulfonetetracarboxylic dianhydride and 150 ml of N-methyl-2-pyrrolidone, 25.9 g of a polyimide resin consisting of the repeating units represented by the formulae (2) and (5) was obtained by the same manner as in Example 1.

The IR spectrum measurement of the resulting polyimide showed typical absorption bands of imide at 1720 cm$^{-1}$ and 1780 cm$^{-1}$. The the molecular weight, glass transition point and temperature of initiating thermal decomposition of the polyimide resin were determined. The results thereof are shown in Table 1.

A liquid ahdesive was produced by dissolving the resultant polyimide resin in tetrahydrofuran (THF) so as to be the concentration of 40% by weight.

Example 31

A liquid adhesive was obtained by mixing 60 parts by weight of the liquid adhesive obtained in Example 2 with 40 parts by weight of the liquid adhesive obtained in Example 14.

Example 32

A liquid adhesive was obtained by mixing 60 parts by weight of the liquid adhesive obtained in Example 2 with 40 parts by weight of the liquid adhesive obtained in Example 15.

Example 33

A liquid adhesive was obtained by mixing 50 parts by weight of the liquid adhesive obtained in Example 25 with 50 parts by weight of the liquid adhesive obtained in Example 14.

Example 34

A liquid adhesive was obtained by mixing 50 parts by weight of the liquid adhesive obtained in Example 25 with 50 parts by weight of the liquid adhesive obtained in Example 29.

Example 35

A liquid adhesive was obtained by mixing 50 parts by weight of the liquid adhesive obtained in Example 26 with 50 parts by weight of the liquid adhesive obtained in Example 14.

Example 36

A liquid adhesive was obtained by mixing 60 parts by weight of the liquid adhesive obtained in Example 25 with 40 parts by weight of the liquid adhesive obtained in Example 30.

Example 37

A liquid adhesive was obtained by mixing 80 parts by weight of the liquid adhesive obtained in Example 25 with 20 parts by weight of the liquid adhesive obtained in Example 30.

Example 38

A liquid adhesive was obtained by mixing 10 parts by weight of alumina filler (produced by showa Denko, which is omitted hereinafter) (particle size: 0.05 μm) with 100 parts by weight of the liquid adhesive obtained in Example 2 to disperse therein.

Example 39

A liquid adhesive was obtained by mixing 10 parts by weight of alumina filler (particle size: 0.05 μm) with 100 parts by weight of the liquid adhesive obtained in Example 6 to disperse therein.

Example 40

A liquid adhesive was obtained by mixing 10 parts by weight of alumina filler (particle size: 0.05 μm) with 100 parts by weight of the liquid adhesive obtained in Example 14 to disperse therein.

Example 41

A liquid adhesive was obtained by mixing 10 parts by weight of alumina filler (particle size: 0.05 μm) with 100 parts by weight of the liquid adhesive obtained in Example 29 to disperse therein.

Example 42

A liquid adhesive was obtained by mixing 10 parts by weight of alumina filler (particle size: 0.05 μm) with 100 parts by weight of the liquid adhesive obtained in Example 35 to disperse therein.

Example 43

A liquid adhesive was obtained by mixing 10 parts by weight of alumina filler (particle size: 0.05 μm) with 100 parts by weight of the liquid adhesive obtained in Example 36 to disperse therein.

Example 44

A liquid adhesive was obtained by mixing 10 parts by weight of silica filler (produced by Arakawa Kagaku Kogyo, which is omitted hereinafter) (particle size: 0.007 μm) with 100 parts by weight of the liquid adhesive obtained in Example 2 to disperse therein.

Example 45

A liquid adhesive was obtained by mixing 10 parts by weight of silica filler (particle size: 0.007 μm) with 100 parts by weight of the liquid adhesive obtained in Example 6 to disperse therein.

Example 46

A liquid adhesive was obtained by mixing 10 parts by weight of silica filler (particle size: 0.007 μm) with 100 parts by weight of the liquid adhesive obtained in Example 14 to disperse therein.

Example 47

A liquid adhesive was obtained by mixing 10 parts by weight of silica filler (particle size: 0.007 μm) with 100 parts by weight of the liquid adhesive obtained in Example 29 to disperse therein.

Example 48

A liquid adhesive was obtained by mixing 10 parts by weight of silica filler (particle size: 0.007 μ) with 100 parts by weight of the liquid adhesive obtained in Example 35 to disperse therein.

Example 49

A liquid adhesive was obtained by mixing 10 parts by weight of silica filler (particle size: 0.007 μm) with 100 parts by weight of the liquid adhesive obtained in Example 36 to disperse therein.

Comparative Example 1

A nylon-epoxy adhesive (TORESINE FS-410, produced by Teikoku Kagaku Sangyo K.K.) (solid content: 20%; solvent isopropyl alcohol:methyl ethyl ketone=2:1) was prepared.

Comparative Example 2

A 20% by weight strength solution of polyimide varnish (Lark TPI, produced by MITUI TOATSU CHEMICALS INC.) in N-methylpyrolidone was prepared.

TABLE 1

|  | Molecular weight | Glass transition point (° C.) | Temperature of initiating thermal decomposition (° C.) |
| --- | --- | --- | --- |
| Ex. 1 | 49,000 | 367 | 421 |
| Ex. 2 | 41,000 | 282 | 446 |
| Ex. 3 | 37,000 | 232 | 400 |
| Ex. 4 | 31,000 | 200 | 421 |
| Ex. 5 | 81,000 | 252 | 420 |
| Ex. 6 | 89,000 | 226 | 410 |
| Ex. 7 | 40,000 | 210 | 405 |
| Ex. 8 | 39,000 | 260 | 410 |
| Ex. 9 | 25,000 | 290 | 420 |
| Ex. 10 | 38,000 | 250 | 410 |
| Ex. 11 | 38,000 | 240 | 420 |
| Ex. 12 | 25,000 | 240 | 410 |
| Ex. 13 | 25,000 | 240 | 420 |
| Ex. 14 | 26,000 | 186 | 458 |
| Ex. 15 | 23,000 | 160 | 410 |
| Ex. 16 | 46,000 | 253 | 422 |
| Ex. 17 | 46,000 | 274 | 436 |
| Ex. 18 | 56,000 | 290 | 420 |
| Ex. 19 | 55,000 | 239 | 404 |
| Ex. 20 | 55,000 | 280 | 420 |
| Ex. 21 | 25,000 | 280 | 410 |
| Ex. 22 | 27,000 | 260 | 420 |
| Ex. 23 | 17,000 | 185 | 427 |
| Ex. 24 | 67,000 | 250 | 427 |
| Ex. 25 | 69,000 | 224 | 421 |
| Ex. 26 | 69,000 | 235 | 420 |
| Ex. 27 | 87,000 | 300 | 420 |
| Ex. 28 | 65,000 | 250 | 421 |
| Ex. 29 | 23,000 | 200 | 419 |
| Ex. 30 | 12,000 | 235 | 420 |
| Ex. 31 | — | 190 | 410 |
| Ex. 32 | — | 165 | 420 |
| Ex. 33 | — | 190 | 410 |
| Ex. 34 | — | 187 | 420 |
| Ex. 35 | — | 190 | 410 |
| Ex. 36 | — | 200 | 420 |
| Ex. 37 | — | 200 | 428 |
| Ex. 38 | 41,000 | 290 | 410 |
| Ex. 39 | 89,000 | 240 | 422 |
| Ex. 40 | 26,000 | 200 | 436 |
| Ex. 41 | 23,000 | 210 | 420 |
| Ex. 42 | — | 200 | 404 |
| Ex. 43 | — | 210 | 412 |
| Ex. 44 | 41,000 | 290 | 420 |
| Ex. 45 | 89,000 | 240 | 420 |
| Ex. 46 | 26,000 | 200 | 420 |
| Ex. 47 | 23,000 | 210 | 421 |
| Ex. 48 | — | 200 | 423 |
| Ex. 49 | — | 210 | 410 |

The measurement of the molecular weight was carried out using tetrahydrofuran as an eluent and shodex 80M×2 as a column. Value of the molecular weight is a number average molecular weight which is calculated as polystyrene. The glass transition point was determined by a differential thermal analysis (in a nitrogen atmosphere, heated at 10° C./min.) and the temperature of initiating thermal decomposition was determined by a thermogravimetry (in a nitrogen atmosphere, heated at 10° C./min.)

(Production of Adhesive Tape)
Production of Adhesive Tape 1

Each of the liquid adhesives obtained from Examples 1 to 49 was applied to both sides of a polyimide film so as to become 20 μm thickness, and dried in a hot air circulating oven at 120° C. for 5 minutes to produce an adhesive tape.
Production of Adhesive Tape 2

Each of the liquid adhesives obtained from Examples 1 to 49 was applied to a surface of a 38 μm thickness release film (polyethylene terephthalate film) which was subjected to release treatment with silicone resin, followed by drying in a hot-air circulating dryer at 150° C. for 5 minutes to produce an adhesive tape with the release film. In this case, the thickness of the ahdesive layer was controlled so as to be 50 μm. When this adhesive tape was used for assembling, the release film would be removed just before pre-attachment of adhesive tape in the following procedure (b).
Production of Comparative Adhesive Tape 1

The liquid adhesive obtained from Comparative Example 1 was applied to both sides of a polyimide film so as to become 20 μm thickness, and dried in a hot air circulating oven at 150° C. for 15 minutes to produce an adhesive tape. In this process, the thickness of each adhesive layer was controlled so as to become 20 μm.

Production of Comparative Adhesive Tape 2

The liquid adhesive obtained from Comparative Example 2 was applied to both sides of a polyimide film so as to become 20 μm thickness, and dried in a hot air circulating oven at 150° C. for 120 minutes, and then 250° C. for 60 minutes to produce an adhesive tape. In this process, the thickness of each adhesive layer was controlled so as to become 20 μm.

(Assembling of Leadframe)

The leadframe used in a semiconductor package as shown in FIG. 1 was assembled according to the following procedures under conditions shown in the Table 2.

(a) Punch Die of Adhesive Tape

The adhesive tape was subjected to punch dying by mold.

(b) Pre-attachment of Adhesive Tape

A metal plane was placed on a hot plate, and the tape punched out in a ring form was pressed onto the plane by means of a metal rod to be pre-attached. When the adhesive tape 2 was used, the release film was removed from the adhesive tape punched out in a ring form prior to the pressing onto the plane.

(c) Assembling of Leadframe

The metal plane to which the adhesive tape had been pre-attached in the above stage and a leadframe were positioned, and heated and pressed on a hot plate heated at 120° C. to adhere the leadframe and the plane via the adhesive tape.

(d) Curing of Adhesive Tape

In a hot-air circulating oven whose atmosphere was substituted by nitrogen, the adhesive tape was cured on the leadframe assembled in the above three stages under the conditions described in Table 2.

TABLE 2

| | Name of Operation | | |
| --- | --- | --- | --- |
| Adhesive tape | Pre-attachment of Adhesive Tape | Assembling of Leadframe | Curing of Adhesive Tape |
| Adhesive Tapes 1 and 2 using adhesives of | 200° C./1 sec./ 4 kgf/cm² | Transition point of each resin + 80° C./1 | None |

TABLE 2-continued

| | Name of Operation | | |
|---|---|---|---|
| Adhesive tape | Pre-attachment of Adhesive Tape | Assembling of Leadframe | Curing of Adhesive Tape |
| Examples 1–49 | | sec./4 kgf/cm² | |
| Comparative Adhesive tape 1 | 80° C./2 sec./ 4 kgf/cm² | 120° C./2 sec./ 4 kgf/cm² | 150° C./3 hrs. |
| Comparative Adhesive tape 2 | 350° C./10 sec./ 4 kgf/cm² | 350° C./15 sec./ 20 kgf/cm² | None |

(Assembling of Semiconductor Package)

Thereafter, the produced leadframe was used to assemble a package according to the following procedures. The reason why the conditions of curing were different at the time of assembling the package is that the characteristics of the adhesives are different from each other. Here, optimum conditions for each adhesive were selected, and the adhesive was cured based on such conditions.

(a) Die Bonding

A semiconductor chip was adhered to a plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, dum cutting, solder plating on the outer leads, etc., the packaging was finished. (The Results of Evaluations of Adhesive Tapes and Semi-conductor Packages)

(a) Oxidization of Leadframe

The evaluation of whether or not the oxidization took place during curing the adhesive was visually determined by observing the color change on the surface of the leadframe.

As a result, since the Adhesive Tapes 1 and 2 of the present invention could be taped at a low temperature, no oxidation occurred, but in the case of the Comparative Adhesive Tape 2 requiring a high adhesion temperature, the color change was observed, indicating that the leadframe was oxidized.

(b) Adhesion Strength

A 90° peel strength of 10 mm wide tape at room temperature was measured after the Adhesive Tape was adhered (taped) onto a copper plate at 140° C.

As a result, the Adhesive Tapes 1 and 2 of the present invention were found to have a strength ranging from 35–50 g/10 mm, while the Comparative Adhesive Tape 1 had the strength of 2–4 g/10 mm, and that of the Comparative Adhesive Tape 2 had the strength of 10–40 g/10 mm, the last value having a large variation.

(c) Void

Whether or not the voids formed when the adhesive was cured was within the level problematic for a practical use was visually evaluated by means of a microscope.

As a result, in the Adhesive Tapes 1 and 2 of the present invention, no void could be found, whereas in the Comparative Adhesive Tapes 1, formation of voids was found.

(d) Processability

Handlings (curl, feedability, etc.) when the adhesive tapes were used in order to assemble leadframes, and the surface tackiness of the adhesive tapes were evaluated.

As a result, the Adhesive Tapes 1 and 2 of the present invention was found to have good handling abilities, and that no tacking occurred on the surfaces, but the Comparative Adhesive Tape 2 was found to be problematic in handling abilities.

(e) Wire Bondability

In the assembling of the package, the wire bondability onto the leadframe when wire bonding with the gold wire was determined.

As a result, in the case of using the Adhesive Tapes 1 and 2 of the present invention, no bonding defect was observed in the tests for 832 pins. On the other hand, in the case of Comparative Ahesive Tape 1, bonding defects were observed in 125 of the 832 pins, indicating that the gold wire bonding could not be done with sufficient strength.

(f) Evaluation of Semiconductor Packages

The packages obtained as described above were tested using the PCBT Test (Pressure Cooker Biased Test). The test was carried out at 5 V of applied voltage at 121° C. at 2 atmospheres and at 100% relative humidity. As a result, in the case of the Adhesive Tapes 1 and 2 of present invention, no shorting took place even after 1,000 hours.

As is clear from the results described above, in the case of the adhesive tapes for electronic parts of the present invention, the semiconductor package can be produced in a good manner. In contrast, the adhesive tapes using adhesives of Comparative Examples are not suitable for manufacturing electronic parts, because there are problems in that oxidation of leadframe occurs, the conditions for adhering are not suitable for assembling the leadframe, and the wire bonding of gold wire cannot be carried out.

What is claimed is:

1. A liquid adhesive for electronic parts which comprises a polyimide resin comprising a repeating unit represented by the following formula (1) dissolved in an organic solvent:

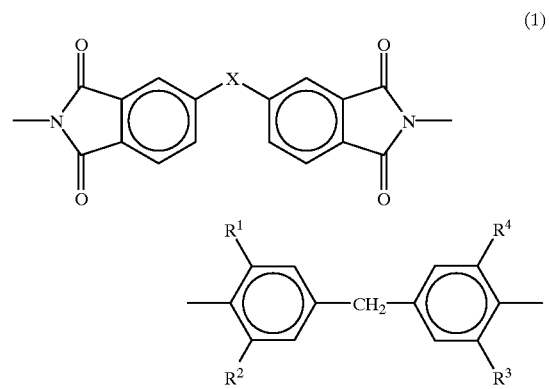

(1)

wherein X is —$SO_2$— or —C(=O)—$OCH_2CH_2O$—C(=O)—, and $R^1$, $R^2$, $R^3$ and $R^4$ are independently an alkyl group having 1 to 4 carbon atoms or an alkoxy group having 1 to 4 carbon atoms.

2. A liquid adhesive for electronic parts as claimed in claim 1 which contains a filler having a praticle size of not more than 1 μm in an amount of from 1 to 50% by weight.

3. A liquid adhesive for electronic parts as claimed in claim 1, wherein the repeating unit represented by the formula (1) consists of repeating units represented by the formulae (2) and (3):

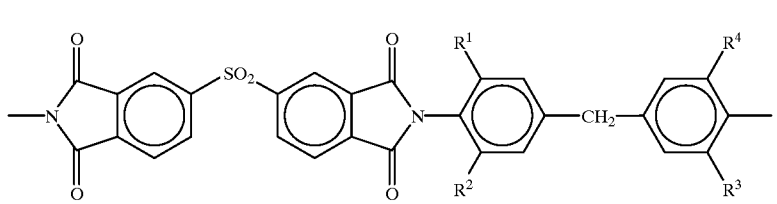

(2)

wherein $R^1$, $R^2$, $R^3$ and $R^4$ are independently an alkyl group having 1 to 4 carbon atoms, or an alkoxy group having 1 to 4 carbon atoms:

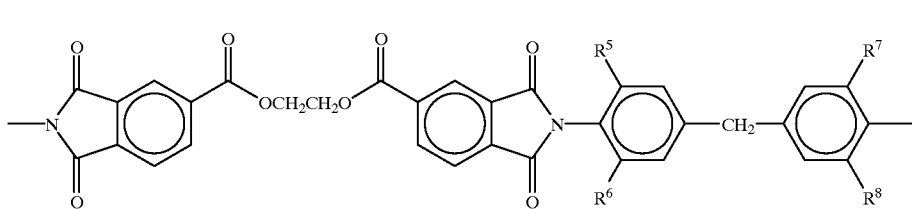

(3)

wherein $R^5$, $R^6$, $R^7$ and $R^8$ are independently an alkyl group having 1 to 4 carbon atoms, or an alkoxy group having 1 to 4 carbon atoms.

4. A liquid adhesive for electronic parts as claimed in claim 1, wherein the polyimide resin consists of a repeating unit represented by the formula (1) and a repeating unit represented by the formula (4):

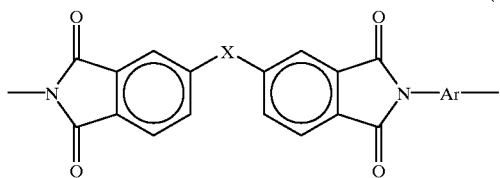

(4)

wherein X is —SO$_2$— or —C(=O)—OCH$_2$CH$_2$O—C(=O)—, and Ar is a divalent group having 1 to 6 benzene rings, provided that the case where Ar is a tetraalkyl substituent of diphenylmethane or a tetraalkoxy substituent of diphenylmethane is excluded out.

5. A liquid adhesive for electronic parts as claimed in claim 4, wherein the proportion of the repeating unit represented by formula (1) is from 40 to 99 mol %, and that of the repeating unit represented by formula (4) is from 60 to 1 mol %.

6. A liquid adhesive for electronic parts as claimed in claim 1, wherein the polyimide resin consists of a repeating unit represented by the formula (1) and a repeating unit represented by the formula (5):

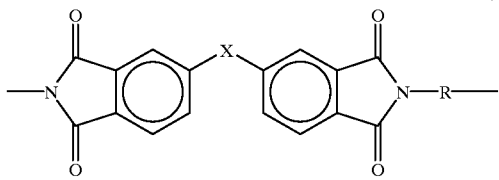

(5)

wherein X is —SO$_2$— or —C(=O)—OCH$_2$CH$_2$O—C(=O)—, and R is an alkylene group having 2 to 20 carbon atoms or a dimethylsiloxane group represented by the formula:

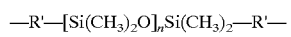

—R'—[Si(CH$_3$)$_2$O]$_n$Si(CH$_3$)$_2$—R'— where

R' is an alkylene group having 1 to 10 carbon atoms or phenoxymethylene group and n is an integer of from 1 to 20.

7. A liquid adhesive for electronic parts as claimed in claim 6, wherein the proportion of the repeating unit represented by the formula (1) is from 40 to 99 mol %, and that of the repeating unit represented by formula (5) is from 60 to 1 mol %.

8. A liquid adhesive for electronic parts as claimed in claim 1, wherein the polyimide resin consists of a repeating unit represented by the formula (1) and a repeating unit represented by the formula (6):

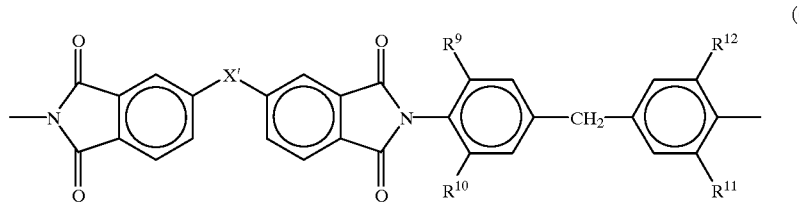
(6)

wherein X' is a direct bond, —O—, —C(=O)—, —C(CH$_3$)$_2$—, or —C(CF$_3$)$_2$—, and R$^9$, R$^{10}$, R$^{11}$ and R$^{12}$ are independently an alkyl group having 1 to 4 carbon atoms or an alkoxy group having 1 to 4 carbon atoms.

9. A liquid adhesive for electronic parts as claimed in claim 8, wherein the proportion of the repeating unit represented by the formula (1) is from 40 to 99 mol %, and that of the repeating unit represented by formula (6) is from 60 to 1 mol %.

* * * * *